United States Patent
Koo et al.

(10) Patent No.: US 7,189,995 B2
(45) Date of Patent: Mar. 13, 2007

(54) ORGANIC ELECTROLUMINESCENCE DISPLAY DEVICE AND METHOD FOR FABRICATING THE SAME

(75) Inventors: Jae-Bon Koo, Yongin-si (KR); Sang-Il Park, Seoul (KR)

(73) Assignee: Samsung SDI Co., Ltd., Suwon (KR)

( * ) Notice: Subject to any disclaimer, the term of this patent is extended or adjusted under 35 U.S.C. 154(b) by 47 days.

(21) Appl. No.: 10/962,704

(22) Filed: Oct. 13, 2004

(65) Prior Publication Data

US 2005/0116291 A1 Jun. 2, 2005

(30) Foreign Application Priority Data

Nov. 29, 2003 (KR) .................. 10-2003-0086119

(51) Int. Cl.
*H01L 29/10* (2006.01)
(52) U.S. Cl. .................. 257/59; 257/66; 257/72; 257/E29.151; 257/E51.005
(58) Field of Classification Search .................. None
See application file for complete search history.

(56) References Cited

U.S. PATENT DOCUMENTS 6,461,899 B1 * 10/2002 Kitakado et al. .......... 438/149

6,626,566 B2 * 9/2003 Holmes et al. .............. 257/59

FOREIGN PATENT DOCUMENTS

KR  1995-0033618  12/1995

* cited by examiner

*Primary Examiner*—Leonardo Andujar
*Assistant Examiner*—Scott R. Wilson
(74) *Attorney, Agent, or Firm*—H.C. Park & Associates, PLC

(57) ABSTRACT

The present invention relates to a thin film transistor for easily displaying gradation of an organic electroluminescence display device and a fabrication method of the thin film transistor, and an organic electroluminescence display device using the thin film transistor. The present invention provides an organic electroluminescence display device comprising a thin film transistor; a protection film and an organic light-emitting device electrically connected to the thin film transistor, wherein an S-factor of the thin film transistor is 0.35 V/dec or more.

14 Claims, 6 Drawing Sheets

ORGANIC ELECTROLUMINESCENCE DISPLAY DEVICE AND METHOD FOR FABRICATING THE SAME

This application claims the benefit of Korean Patent Application No. 2003-86119, filed on Nov. 29, 2003, which is hereby incorporated by reference for all purposes as if fully set forth herein.

BACKGROUND OF THE INVENTION

1. Field of the Invention

The present invention relates to an apparatus for use in a display device and a method for fabricating the same, more particularly, to an apparatus for use in a display device in which gray scale is easily displayed, and a method for fabricating the same.

2. Discussion of Related Art

Generally, circuits with complementary metal oxide semiconductor (CMOS) thin film transistors (TFTs) are used for driving active matrix liquid crystal displays (AMLCD), active matrix organic electroluminescence display devices (AMOLED), and active matrix flat panel display devices, including image sensors.

In an active matrix flat panel display device, N-type metal oxide semiconductor (NMOS) TFTs, which are typically used in circuits and as switching transistors, and P-type metal oxide semiconductor (PMOS) TFTs, which are typically used as driving transistors, have different required characteristics.

Particularly in an AMOLED, TFTs used in circuits and as switching transistors must have a low threshold voltage and a low S-factor, which is the reciprocal of the slope of the curve of source/drain current according to a change of gate voltage, and driving TFTs must have a high S-factor for displaying gradation.

Korean Patent Laid-open Publication No. 1995-33618 discloses a method for fabricating a TFT by varying the thickness of the polysilicon film depending upon whether the TFT is used in a circuit or as part of a pixel part, thereby varying the TFT characteristics.

However, varying polysilicon film thickness per TFT positions is a complicated process, requiring control of many variables to lower the characteristics of driving transistors only.

SUMMARY OF THE INVENTION

Accordingly, the present invention is directed to an apparatus for use in a display device and a method for fabricating the same that substantially obviates one or more of the problems due to limitations and disadvantages of the related art.

This invention provides an apparatus for use in a display device in which gradation is displayed easily by optimizing heat treatment conditions of thin film transistors, and a method for fabricating the apparatus for use in a display device.

Additional features of the invention will be set forth in the description which follows, and in part will be apparent from the description, or may be learned by practice of the invention.

The present invention discloses an organic electroluminescence display device comprising a thin film transistor comprising an active layer formed on an insulating substrate and equipped with source regions and drain regions, a gate electrode, and source electrodes and drain electrodes electrically coupled to the source regions and drain regions. A protection film is formed on a surface of an insulating substrate having the thin film transistor and equipped with a via hole for exposing a part of the source electrode or the drain electrode; and an organic emitting device electrically coupled to the thin film transistor through the via hole, wherein an S-factor of the thin film transistor is 0.35 V/dec or more.

The present invention also discloses a method for fabricating an organic electroluminescence display device comprising the steps of forming a thin film transistor comprising an active layer having a source region and a drain on an insulating substrate, a gate electrode, and a source electrode and a drain electrode electrically coupled to the source region and the drain region. A protection film is formed on a surface of an insulating substrate having the thin film transistor, and heat treating the insulating substrate comprising the protection film, wherein an S-factor of the thin film transistor after heat treatment is 0.35 V/dec or more.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE INVENTION

Figure 1A:
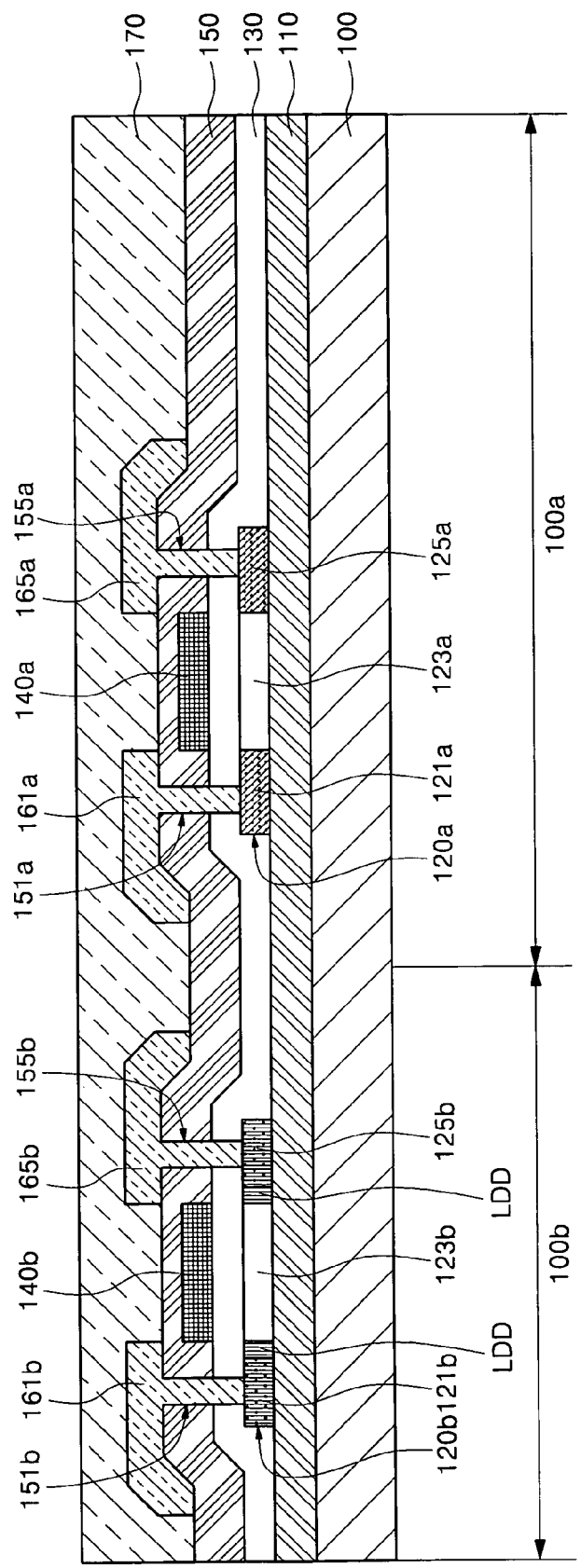
FIG. 1A and FIG. 1B show an organic electroluminescence display device according to exemplary embodiments of the present invention.

Reference will now be made in detail to an embodiment of the present invention, example of which is illustrated in the accompanying drawings. For reference, like reference characters designate corresponding parts throughout several views.

Figure 1B:
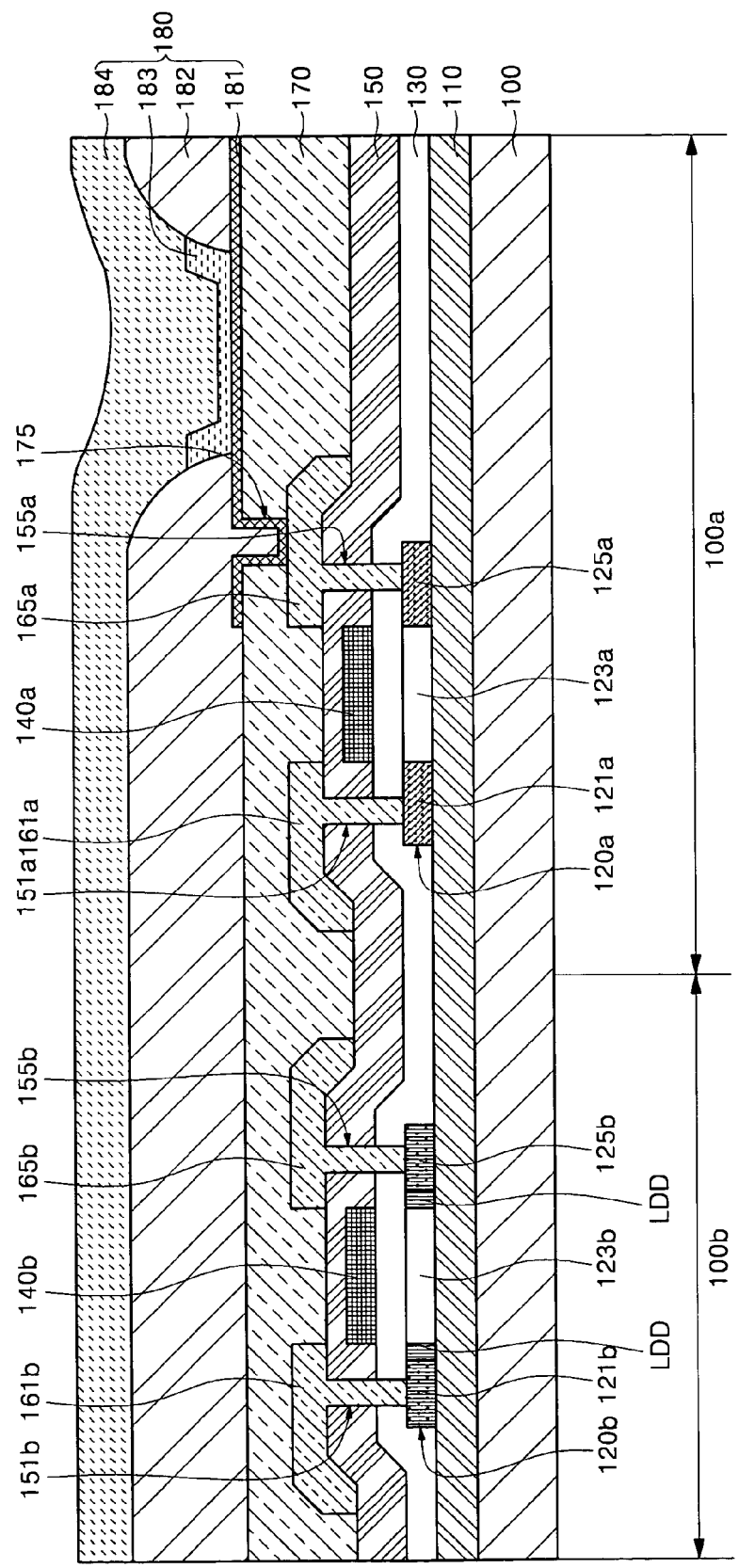

FIG. 1A and FIG. 1B show an organic electroluminescence display device according to exemplary embodiments of the present invention.

Referring to FIG. 1A, a buffer layer (diffusion barrier) 110 that prevents impurities, such as metal ions diffused from the insulating substrate, from penetrating an active layer (polycrystalline silicon) is deposited on an insulating substrate 100 by PECVD, LPCVD and sputtering. The insulating substrate 100 comprises a PMOS region 100a, on which a PMOS TFT is formed, and a NMOS region 100b, on which a NMOS TFT is formed.

An amorphous silicon film is deposited on the buffer layer 110, by a PECVD, LPCVD or sputtering process, and a dehydrogenation process may be subsequently performed on the film in a vacuum furnace. The dehydrogenation process is not necessary when the LPCVD or sputtering process is used to deposit the amorphous silicon film on the buffer layer.

A high energy is then irradiated onto the amorphous silicon film in order to produce polycrystalline silicon film.

This crystallization may be performed using ELA, MIC, MILC, Sequential Lateral Solidification (SLS), SPC, or other similar process.

Active layers 120a, 120b are formed on PMOS region 100a and NMOS region 100b by patterning the polycrystalline silicon film.

A photoresist is then formed on the surface of the insulating substrate 100, and a photoresist pattern for exposing the NMOS region 100b and the active layer 120b is formed by exposing the photoresist to light.

After forming the photoresist pattern, N-type dopant is channel doped in the active layer 120b, using the photoresist pattern as a mask, to give conductivity to the NMOS TFT.

An organic electroluminescence display device according to an exemplary embodiment of the present invention is constructed in an ordinary NMOS TFT structure, lightly doped drain (LDD) structure or offset structure. A NMOS TFT comprising a LDD region is discussed below.

After doping the active layer 120b, the photoresist pattern is removed, and a gate insulating film 130 is formed on the buffer layer 110 and active layers 120a, 120b.

A gate electrode material is deposited on the gate insulating film 130 and etched to form gate electrodes 140a, 140b.

After forming the gate electrodes 140a, 140b, low concentration source/drain regions 121b, 125b are formed by forming a photoresist pattern on the gate electrodes 140a, 140b, for exposing the NMOS region 100b, and doping N-type low concentration impurities to form a LDD region on the photoresist pattern.

Next, a photoresist pattern for preventing contamination of the NMOS region, and for forming source/drain regions 121a, 125a of the PMOS TFT, is formed by coating a photoresist on the substrate and exposing the photoresist.

P-type high concentration impurities are doped on the photoresist pattern to form source/drain regions 121a, 125a of the PMOS TFT. A region between the source/drain regions 121a, 125a of the PMOS TFT acts as a channel region 123a of the PMOS TFT.

The photoresist pattern for forming the source/drain regions 121a, 125a of the PMOS TFT is then removed, and a photoresist pattern for preventing contamination of the PMOS region and forming source/drain regions 121b, 125b of the NMOS TFT is formed again on the insulating substrate 100.

The source/drain regions 121b, 125b comprising the LDD region of the NMOS TFT are formed by doping N-type high concentration impurities on a mask of the photoresist pattern. A region between the source/drain regions 121b, 125b of the NMOS TFT acts as a channel region 123b of the NMOS TFT.

After removing the photoresist pattern for forming the source/drain regions 121b, 125b, an interlayer insulating film 150 is formed on the gate insulating film 130 and gate electrodes 140a, 140b.

Contact holes 151a, 151b, 155a and 155b, which expose the source/drain regions 121a, 121b, 125a and 125b, are formed by patterning the interlayer insulating film 150.

Source/drain electrodes 161a, 161b, 165a and 165b are formed by depositing and patterning a certain conductive metallic material on the surface of the substrate, thereby forming the PMOS and NMOS TFTs.

A protection film 170 is then formed on the surface of the substrate. The protection film 170 may be an inorganic film formed of an inorganic insulating material containing hydrogen, such as SiNx containing hydrogen.

After forming the protection film 170, the entire substrate is heat treated in a furnace, wherein charge mobility of the TFTs is increased and threshold voltage is lowered. This may improve electrical characteristics by relieving damage of a lower structure generated while forming the PMOS and NMOS TFTs as hydrogen contained in the protection film 170 is diffused.

Referring to FIG. 1B, after the heat treatment process, the protection film 170 is patterned to form a via hole 175 to expose either source/drain electrode 161a, 165a. In the exemplary embodiment of the present invention illustrated in FIG. 1B, the via hole 175 exposes the drain electrode 165a of the PMOS TFT.

Formation of the light-emitting device 180, which is electrically coupled to the drain electrode 165a through the via hole 175, completes the formation of an active matrix flat panel display device.

The light-emitting device 180 may be an organic light-emitting device comprised of a lower electrode 181 electrically coupled to the drain electrode 165a through the via hole 175, a pixel defining film 182 with an opening for exposing a part of the lower electrode 181, an organic light-emitting layer 183 formed on a portion of the lower electrode 181 in the opening of the pixel defining film 182, and an upper electrode 184.

The organic light-emitting layer 183 may consist of various layers including at least one or more of the following layers: light-emitting layer, hole injection layer (HIL), hole transport layer (HTL), hole blocking layer (HBL), electron transport layer (ETL) and electron injection layer (EIL).

Tables 1 and 2 below show charge mobility and S-factor of a PMOS TFT and a NMOS TFT fabricated in accordance with exemplary embodiments of the present invention. FIGS. 2A, 2B, 2C and 2D show source/drain currents according to a change of gate voltage of a PMOS TFT and a NMOS TFT fabricated in accordance with exemplary embodiments of the invention.

TABLE 1

| Drive-in conditions | PMOS | | | |
|---|---|---|---|---|
| | Charge mobility ($cm^2$/Vs) | | S-factor (V/dec) | |
| | Average | Standard | Average | Standard |
| 250° C. 3 h | 77.30 | 1.44 | 0.65 | 0.02 |
| 250° C. 3 h | 74.94 | 1.40 | 0.69 | 0.03 |
| 250° C. 3 h | 78.43 | 0.66 | 0.64 | 0.03 |
| 300° C. 3 h | 86.16 | 1.89 | 0.49 | 0.04 |
| 300° C. 3 h | 86.48 | 1.83 | 0.47 | 0.03 |
| 300° C. 3 h | 85.43 | 1.53 | 0.49 | 0.03 |
| 300° C. 3 h | 86.23 | 1.50 | 0.48 | 0.02 |
| 300° C. 3 h | 85.26 | 1.21 | 0.48 | 0.02 |
| 340° C. 3 h | 91.78 | 1.21 | 0.40 | 0.02 |
| 340° C. 3 h | 96.00 | 1.58 | 0.36 | 0.02 |
| 340° C. 3 h | 90.82 | 2.23 | 0.37 | 0.03 |
| 380° C. 3 h | 100.45 | 1.84 | 0.30 | 0.01 |
| 380° C. 3 h | 101.25 | 2.26 | 0.29 | 0.01 |
| 380° C. 3 h | 103.22 | 1.86 | 0.29 | 0.02 |

TABLE 2

| Drive-in conditions | NMOS | | | |
|---|---|---|---|---|
| | Charge mobility (cm²/Vs) | | S-factor (V/dec) | |
| | Average | Standard | Average | Standard |
| 250° C. 3 h | 1.09 | 0.26 | 0.74 | 0.02 |
| 250° C. 3 h | 1.03 | 0.29 | 0.73 | 0.02 |
| 250° C. 3 h | 1.38 | 0.32 | 0.72 | 0.02 |
| 300° C. 3 h | 30.66 | 1.85 | 0.53 | 0.02 |
| 300° C. 3 h | 36.82 | 2.53 | 0.54 | 0.02 |
| 300° C. 3 h | 31.18 | 3.5 | 0.58 | 0.03 |
| 300° C. 3 h | 37.30 | 3.81 | 0.55 | 0.03 |
| 300° C. 3 h | 30.55 | 5.30 | 0.57 | 0.02 |
| 340° C. 3 h | 63.76 | 4.22 | 0.41 | 0.03 |
| 340° C. 3 h | 66.76 | 4.49 | 0.39 | 0.02 |
| 340° C. 3 h | 65.52 | 3.15 | 0.38 | 0.03 |
| 380° C. 3 h | 90.32 | 2.36 | 0.28 | 0.02 |
| 380° C. 3 h | 87.28 | 4.47 | 0.29 | 0.02 |
| 380° C. 3 h | 85.73 | 9.49 | 0.30 | 0.02 |

Figure 2A:
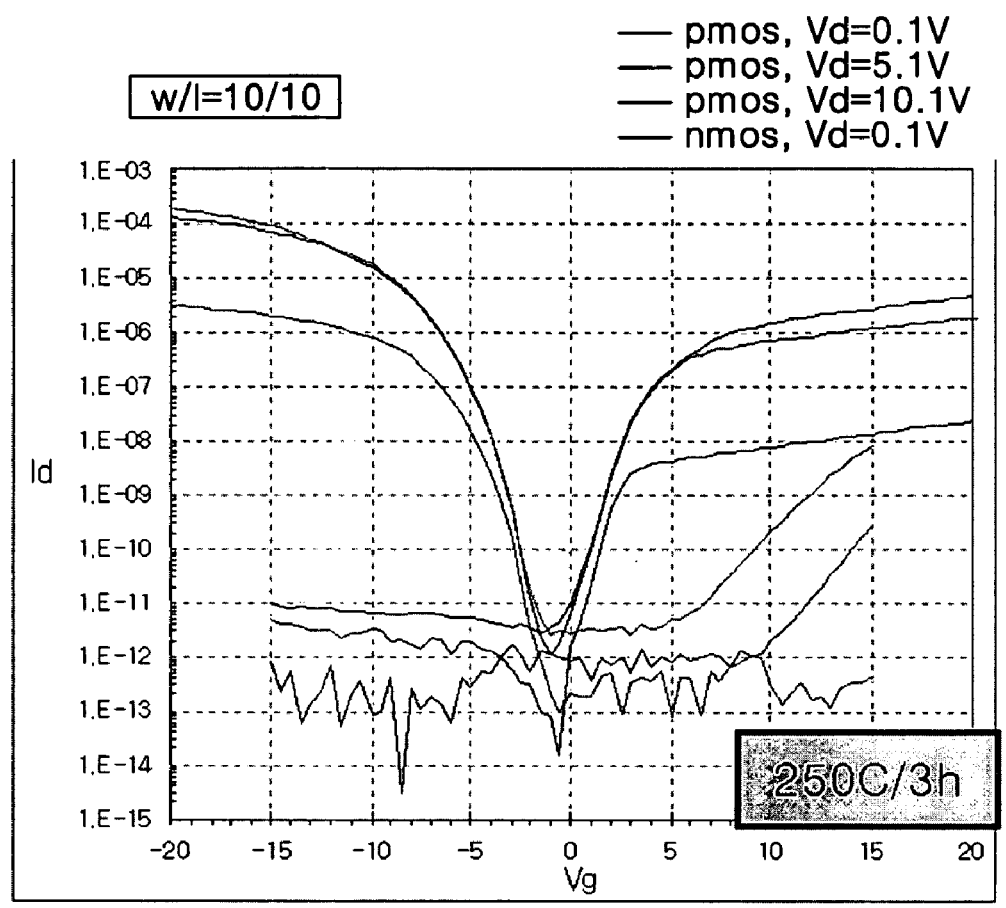
FIG. 2A, FIG. 2B, FIG. 2C, and FIG. 2D show source/drain currents according to a change of gate voltage for PMOS and NMOS TFTs fabricated according to exemplary embodiments of the present invention.

Referring to Tables 1, 2 and FIG. 2A, a PMOS TFT heat treated at 250° C. for 3 hours has an S-factor of about 0.66 V/dec, and charge mobility of about 76.9 cm²/Vs. A NMOS TFT, under the same conditions, has an S-factor of about 0.73 V/dec, and charge mobility of about 1.17 cm²/Vs. While the PMOS TFT's S-factor is high enough to display gradation of an organic electroluminescence display device, the NMOS TFT's charge mobility is very small. Therefore, it would be difficult to drive circuits utilizing these TFTs because the ratio of the PMOS TFT charge mobility to the NMOS TFT charge mobility is too small.

Figure 2B:
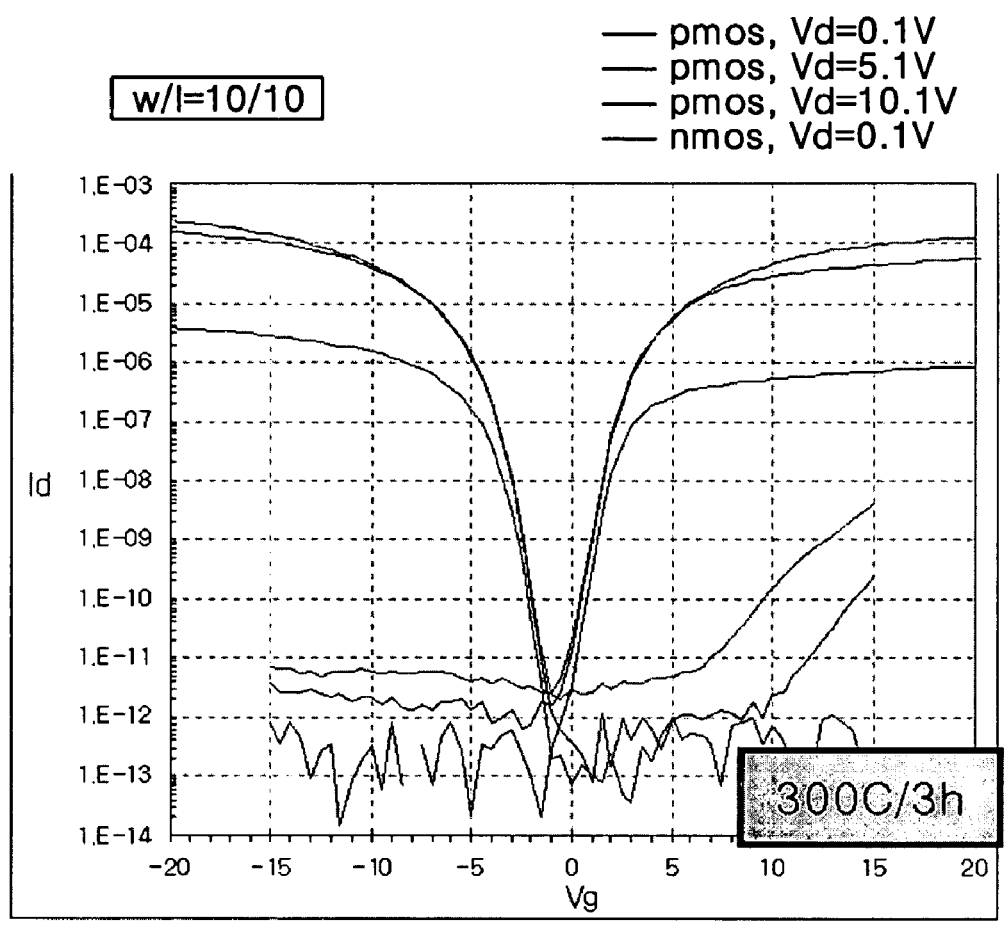

Referring to Tables 1, 2 and FIG. 2B, the PMOS TFT heat treated at 300° C. for 3 hours has an S-factor of about 0.48 V/dec, and charge mobility of about 85.91 cm²/Vs. The NMOS TFT has an S-factor of about 0.55 V/dec, and charge mobility of about 30.30 cm²/Vs.

Figure 2C:
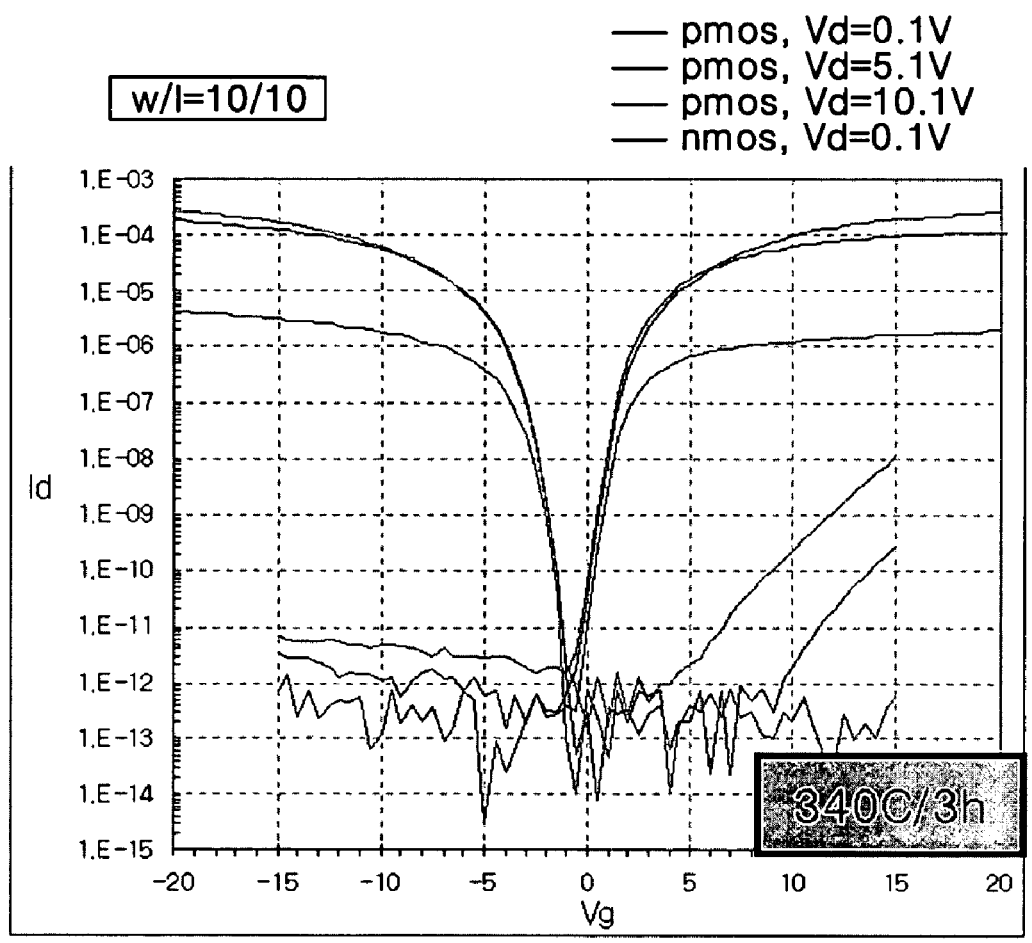

Referring to Tables 1, 2 and FIG. 2C, the PMOS TFT heat treated at 340° C. for 3 hours has an S-factor of about 0.38 V/dec, and charge mobility of about 92.9 cm²/Vs. The NMOS TFT has an S-factor of about 0.39 V/dec, and charge mobility of about 65.35 cm²/Vs.

Figure 2D:
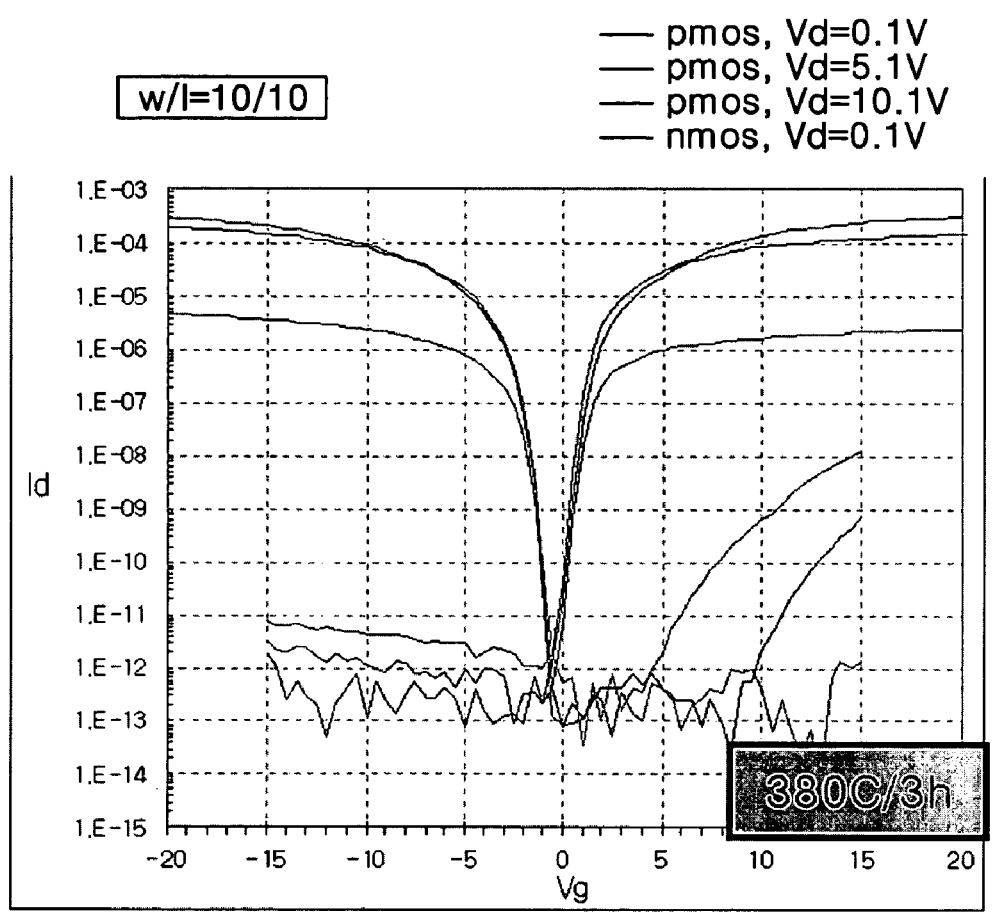

Referring to Tables 1, 2 and FIG. 2D, the PMOS TFT heat treated at 380° C. for 3 hours has an S-factor of about 0.29 V/dec, and charge mobility of about 101.6 cm²/Vs. The NMOS TFT has an S-factor of about 0.29 V/dec, and charge mobility of about 87.8 cm²/Vs. In this case, the PMOS TFT's S-factor value of 0.29 V/dec is insufficient for displaying gradation of an organic electroluminescence display device.

In order to display gradation of an organic electroluminescence display device, PMOS TFT S-factor values should be 0.35 V/dec or more. Considering TFT characteristics from Tables 1, 2 and FIGS. 2A, 2B, 2C and 2D, the heat treatment process should be performed at 350° C. or less. So that circuits comprising NMOS TFTs operate normally, the heat treatment process should be performed at 300° C. or more. Consequently, the heat treatment process may be carried out in the temperature range of about 300 to about 350° C.

The heat treatment process of the present invention may form an organic electroluminescence display device having superior gradation display.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescence display device, comprising:
    an insulating substrate;
    a thin film transistor formed on the insulating substrate, comprising:
        an active layer equipped with a source region and a drain region;
        a gate electrode; and
        a source electrode and a drain electrode electrically coupled to the source region and the drain region;
    a protection film formed on the insulating substrate having the thin film transistor and equipped with a via hole for exposing a part of the source electrode or the drain electrode; and
    an organic light-emitting device electrically coupled to the thin film transistor through the via hole,
    wherein an S-factor of the thin film transistor is 0.4 V/dec or more, and a charge mobility of the thin film transistor is in a range of 85 cm²/Vs to 96 cm²/Vs.

2. The organic electroluminescence display device of claim 1, wherein the S-factor of the thin film transistor is 0.4 to 0.6 V/dec.

3. The organic electroluminescence display device of claim 1, wherein the protection film comprises an inorganic insulating material containing hydrogen.

4. The organic electroluminescence display device of claim 3, wherein the inorganic insulating material containing hydrogen is comprised of SiNx containing hydrogen.

5. A method for fabricating an organic electroluminescence display device, comprising:
    forming a thin film transistor comprising an active layer having a source region and a drain region on an insulating substrate, a gate electrode, and a source electrode and a drain electrode coupled to the source region and the drain region;
    forming a protection film on the insulating substrate having the thin film transistor; and
    heat-treating the insulating substrate with the protection film formed thereon,
    wherein an S-factor of the thin film transistor after heat treatment is 0.4 V/dec or more, and a charge mobility of the thin film transistor is in a range of 85 cm²/Vs to 96 cm²/Vs.

6. The method of claim 5, wherein the S-factor of the thin film transistor after heat treatment is 0.4 to 0.6 V/dec.

7. The method of claim 5, wherein the protection film comprises an inorganic insulating material containing hydrogen.

8. The method of claim 7, wherein the protection film is formed with SiNx containing hydrogen.

9. The method of claim 5, wherein the heat treating is performed at a temperature of about 350° C. or less for about 3 hours.

10. The method of claim 9, wherein the heat treating is performed at a temperature in the range of about 300 to about 350° C. for about 3 hours.

11. An organic electroluminescence display device, comprising:
    an insulating substrate;
    a thin film transistor formed on the insulating substrate, comprising:
        an active layer equipped with a source region and a drain region;

a gate electrode; and a source electrode and a drain electrode electrically coupled to the source region and the drain region;

a protection film formed on the insulating substrate having the thin film transistor and equipped with a via hole for exposing a part of the source electrode or the drain electrode; and an organic light-emitting device electrically coupled to the thin film transistor through the via hole, wherein an S-factor of the thin film transistor is 0.35 V/dec or more, and a charge mobility of the thin film transistor is in a range of 85 cm$^2$/Vs to 96 cm$^2$/Vs.

12. The organic electroluminescence display device of claim 11, wherein the S-factor of the thin film transistor is 0.35 to 0.6 V/dec.

13. The organic electroluminescence display device of claim 11, wherein the protection film comprises an inorganic insulating material containing hydrogen.

14. The organic electroluminescence display device of claim 13, wherein the inorganic insulating material containing hydrogen is comprised of SiNx containing hydrogen.

* * * * *